United States Patent
Nagaraja et al.

(10) Patent No.: US 9,312,293 B2
(45) Date of Patent: Apr. 12, 2016

(54) RANGE MODULATED IMPLANTS FOR IMAGE SENSORS

(71) Applicant: SEMICONDUCTOR COMPONENTS INDUSTRIES, LLC, Phoenix, AZ (US)

(72) Inventors: Satyadev Nagaraja, San Jose, CA (US); Rayner Barboza, Sunnyvale, CA (US); Giovanni Margutti, Avezzano (IT)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 14/470,584

(22) Filed: Aug. 27, 2014

(65) Prior Publication Data

US 2015/0064836 A1    Mar. 5, 2015

Related U.S. Application Data

(60) Provisional application No. 61/870,338, filed on Aug. 27, 2013.

(51) Int. Cl.
| | |
|---|---|
| H01L 21/425 | (2006.01) |
| H01L 21/00 | (2006.01) |
| H01L 21/8249 | (2006.01) |
| H01L 27/146 | (2006.01) |
| H01L 21/265 | (2006.01) |
| H01L 21/266 | (2006.01) |

(52) U.S. Cl.
CPC .......... *H01L 27/1463* (2013.01); *H01L 21/266* (2013.01); *H01L 21/2652* (2013.01); *H01L 27/14641* (2013.01); *H01L 27/14643* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 6,027,989 A * | 2/2000 | Poole et al. | 438/522 |
| 6,329,218 B1 | 12/2001 | Pan | |
| 6,362,052 B1 * | 3/2002 | Rangarajan et al. | 438/262 |
| 6,436,768 B1 * | 8/2002 | Yang et al. | 438/266 |
| 7,098,067 B2 | 8/2006 | Adkisson | |
| 7,160,753 B2 | 1/2007 | Williams | |
| 7,608,870 B2 | 10/2009 | Cole | |
| 8,409,909 B2 | 4/2013 | Nagaraja | |
| 2005/0142734 A1* | 6/2005 | Shin | H01L 21/76224 438/253 |
| 2010/0035421 A1* | 2/2010 | Denison | H01L 21/2652 438/514 |
| 2010/0065938 A1 | 3/2010 | Mabuchi | |
| 2012/0009723 A1* | 1/2012 | Nagaraja | H01L 21/26513 438/73 |

* cited by examiner

*Primary Examiner* — Calvin Choi
*Assistant Examiner* — Xiaoming Liu
(74) *Attorney, Agent, or Firm* — Treyz Law Group, P.C.; Kendall P. Woodruff

(57) ABSTRACT

Image sensors may include a plurality of photodiodes. The photodiodes may be isolated from each other using isolations regions formed from p-well or n-well implants. Deep and narrow isolation regions may be formed using a multi-step process that selectively places implants at desired depths in a substrate. If desired, the multi-step process may include only one photolithographic patterning step, which in turn can help reduce costs, fabrication time, and alignment errors. The process may include passing ions through a stack of alternating layers of material such as alternating layers of oxide and nitride. After each implant, a layer in the stack may be removed and ions may be passed through the layers remaining in the stack to form an implant at a different depth in the substrate.

17 Claims, 8 Drawing Sheets

RANGE MODULATED IMPLANTS FOR IMAGE SENSORS

This application claims the benefit of provisional patent application No. 61/870,338 filed Aug. 27, 2013, which is hereby incorporated by reference herein in its entirety.

BACKGROUND

The present invention relates to integrated circuits and, more particularly, to forming implanted regions in CMOS (complementary metal oxide semiconductor) image sensors.

Digital cameras are often provided with digital image sensors such as CMOS image sensors. Digital cameras may be stand-alone devices or may be included in electronic devices such as cellular telephones or computers. A typical CMOS image sensor has an image sensor pixel array containing contain thousands or millions of pixels. Each pixel includes a photosensitive element such as a photodiode formed in a substrate. Isolation regions may be formed in the substrate between photodiodes to reduce crosstalk between photodiodes. Isolation regions may be formed using ion implantation.

To improve image quality, it is often desirable to increase the number and density of pixels on an image sensor. The density of pixels can be represented by a quantity called "pixel pitch," in which higher pixel pitches represent lower pixel densities and bigger pixel sizes. As pixel pitches are decreased, photodiodes may need to be formed deeper in a substrate to avoid loss of sensitivity. Deeper photodiodes may require deeper isolation regions.

Some methods for implanting isolation regions include multiple repetitive steps. Each step includes depositing and patterning a layer of photoresist using photolithography, implanting ions through the patterned photoresist, and then stripping the layer of photoresist before implanting additional ions into the substrate. This process is repeated multiple times until the resulting implants have the desired depth.

Repetitively depositing and patterning photoresist using photolithography is costly and consumes a significant portion of fabrication line capacity. Alignment errors may also result since the photoresist pattern has to be re-created at each step.

It would therefore be desirable to be able to provide improved methods for forming implanted regions in image sensors.

DETAILED DESCRIPTION

Figure 1:
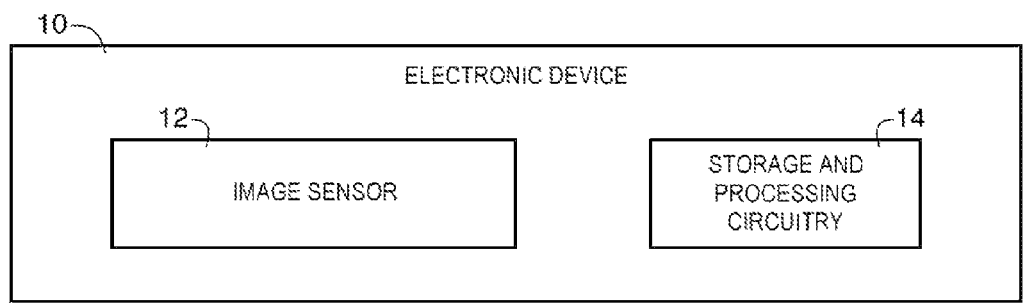
FIG. 1 is a diagram of an illustrative electronic device having an image sensor in accordance with an embodiment of the present invention.

Digital image sensors are widely used in digital cameras and in electronic devices such as cellular telephones, computers, and computer accessories. An illustrative electronic device 10 with an image sensor 12 and storage and processing circuitry 14 is shown in FIG. 1. Electronic device 10 may be a digital camera, a computer, a computer accessory, a cellular telephone, or other electronic device. Image sensor 12 may be part of a camera module that includes a lens or may be provided in an electronic device that has a separate lens. During operation, the lens focuses light onto image sensor 12. Image sensor 12 may have an array of image sensor pixels containing photosensitive elements such as photodiodes that convert light into digital data. Image sensors may have any number of pixels (e.g., hundreds, thousands, millions, or more). A typical image sensor may, for example, have millions of pixels (e.g., megapixels).

Image data from image sensor 12 may be provided to storage and processing circuitry 14. Storage and processing circuitry 14 may process the digital image data that has been captured with sensor 12. The processed image data may be maintained in storage in circuitry 14. The processed image data may also be provided to external equipment. Storage and processing circuitry 14 may include storage components such as memory integrated circuits, memory that is part of other integrated circuits such as microprocessors, digital signal processors, or application specific integrated circuits, hard disk storage, solid state disk drive storage, removable media, or other storage circuitry. Processing circuitry in storage and processing circuitry 14 may be based on one or more integrated circuits such as microprocessors, microcontrollers, digital signal processors, application-specific integrated circuits, image processors that are incorporated into camera modules, other hardware-based image processing circuits, combinations of these circuits, etc. If desired, image sensor 12 and processing circuitry 14 may be implemented using a single integrated circuit or may be implemented using separate integrated circuits.

Figure 2:
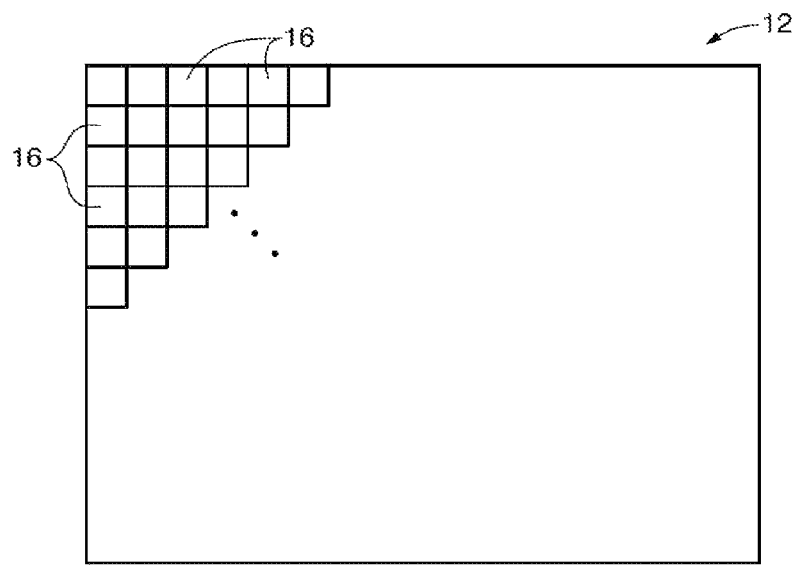
FIG. 2 is a top view of an illustrative image sensor pixel array in accordance with an embodiment of the present invention.

An illustrative image sensor pixel array 12 is shown in FIG. 2. Image sensor 12 of FIG. 2 has an array of image pixels 16. Pixels 16 are typically organized in rows and columns. Each pixel contains a photosensitive element such as a photodiode and corresponding electrical components (e.g., transistors, charge storage elements, and interconnect lines for routing electrical signals).

Figure 3:
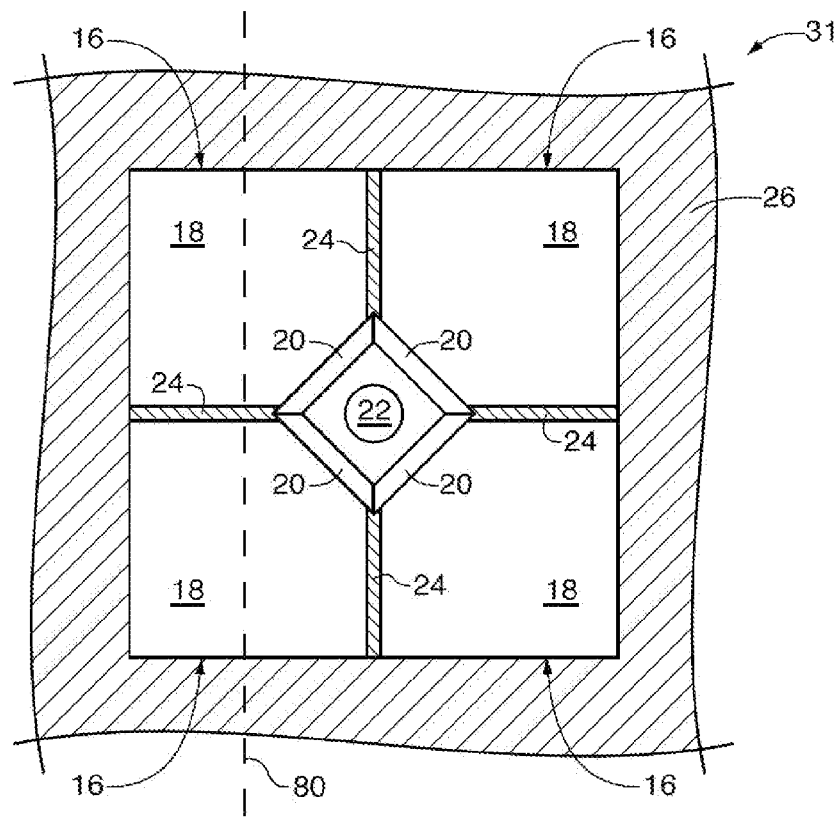
FIG. 3 is a top view of a portion of an illustrative image sensor pixel array having isolation structures in accordance with an embodiment of the present invention.

FIG. 3 is a diagram showing a portion of an array of image sensor pixels 16. In the example of FIG. 3, each pixel 16 has a photodiode 18. Photodiodes 18 may be formed in substrate 31. Photons may strike photodiodes 18 and generate charge. Charge can be transferred to floating diffusion region 22 by turning transfer gates 20 momentarily on. Photodiodes 18 within pixel 16 may be separated by isolation regions 24. Isolation region 26 may separate photodiodes 18 from array transistors and from adjacent pixels.

If desired, each pixel 16 may include a separate floating diffusion node. The example of FIG. 3 in which four pixels 16 share floating diffusion node 22 is merely illustrative.

Substrate 31 may be a silicon substrate. Substrate 31 may, for example, be a doped substrate such as a p-type substrate or a p+substrate. Substrate 31 may have an epitaxial layer such as a p-type or n-type epitaxial layer. If desired, substrate 31 may be a silicon-on-insulator (SOI) substrate and may have a buried oxide layer (BOX). Isolation regions 24 may be p-well regions or n-well regions. Isolation regions 24 may be formed using ion implantation. For example, ions such as boron, beryllium, indium, magnesium, arsenic, phosphorus or other suitable dopant ions may be implanted in substrate 31 to from regions 24.

Figure 4:
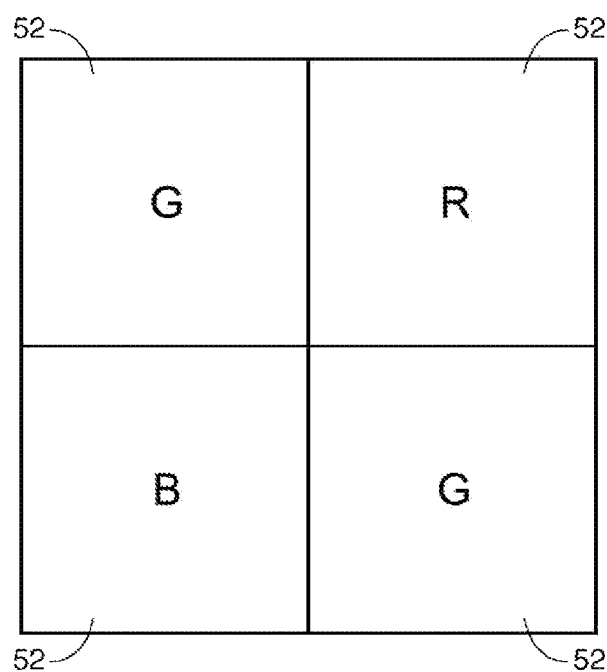
FIG. 4 is a top view of illustrative color filter elements that may be used in an image sensor pixel array in accordance with an embodiment of the present invention.

Incoming light may pass through a color filter before striking one of photodiodes 18 of FIG. 3. FIG. 4 is a top view of illustrative color filter elements that may filter light for pixels 16 of FIG. 3. The color filter pattern of FIG. 4 has red (R), green (G), and blue (B) color filter elements 52 and is sometimes referred to as a Bayer pattern. The pattern of FIG. 4 is merely illustrative, however. If desired, other patterns and/or other filter elements (e.g., filter elements having different spectral responses) may be used.

The quality of the images captured using image sensor 12 may be influenced by a variety of factors. For example, the size of the pixel array in image sensor 12 may have an impact on image quality. Large image sensors with large numbers of image pixels will generally be able to produce images with higher quality or resolution than smaller image sensors having fewer image pixels.

In order to increase the number of pixels, it may be desirable to decrease the size of the pixels. It may be desirable to decrease the pixel pitch of an image sensor, which is a measure of the distance between equivalent pixels. For example, pixel pitches for image sensors may be 10 microns or less, 5 microns or less, one micron or less, etc. As pixel pitch is reduced, it may be desirable to decrease the widths of isolation regions such as isolation regions 24 between photodiodes 18 so that the active portion of the pixels is maximized. For example, it may be desirable to form isolation regions with widths of 2 microns or less, 1 micron or less, 0.5 microns or less, 0.3 microns or less, etc. It may be desirable to have isolation regions that extend from the surface of a substrate to a depth of, e.g. 3-5 microns, 3 microns or more, 4 microns or more, etc. Desired width vs. height aspect ratios for an isolation region may be, for example, approximately 1:8, 1:7 or greater, 1:8 or greater, 1:9 or greater, etc.

The implantation of narrow isolation regions that are suitably deep may present challenges. Typically, photoresist is used as an implant mask. The photoresist is deposited on a substrate and patterned with openings where implants are desired. However, it may be difficult to pattern photoresist where narrow and deep implants are desired. If deep implants are desired, photoresist is needed that is thick enough to stop high beam energies. However, if thick photoresist is patterned with very narrow openings, the walls of the openings may be unstable or sloped instead of vertical, and photoresist residue may remain at the bottom of the opening due to incomplete removal of the resist.

Isolation regions such as isolation regions 24 of FIG. 3 may be formed using a multi-step approach that selectively forms implant regions at different depths in a substrate. Such implants may sometimes be referred to as range modulated implants. The implants may be connected to form isolation regions that are suitably narrow and deep. FIGS. 5-16 show cross-sectional side views of an illustrative image sensor at sequential stages of the implantation process. FIG. 16 may, for example, correspond to a cross-section taken along line 80 of FIG. 3.

Figure 5:
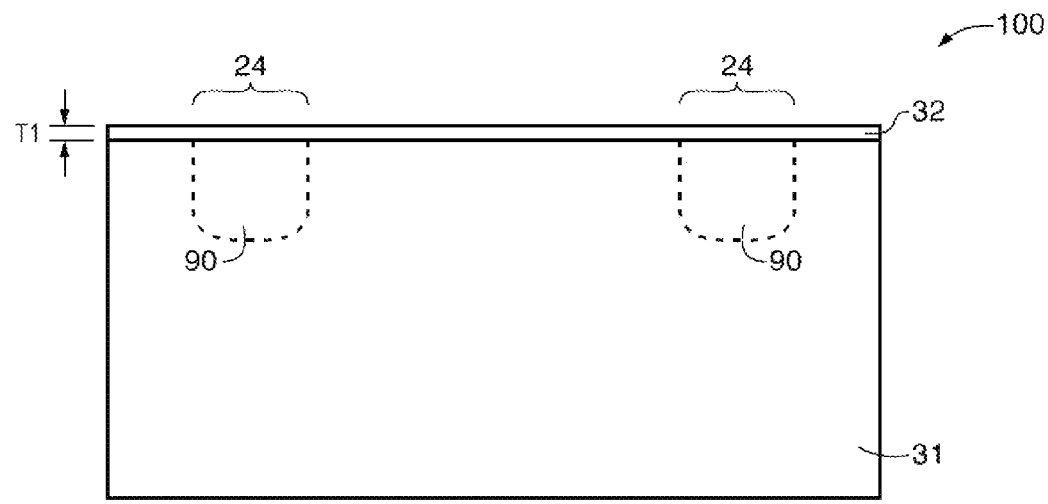
FIG. 5 is a cross-sectional side view of a portion of an image sensor after a screen oxide layer has been deposited on a surface of an image sensor substrate in accordance with an embodiment of the present invention.

At step 100 of FIG. 5, a screen oxide layer such as screen oxide layer 32 may be deposited on an upper surface of silicon substrate 31. Substrate 31 may be a p+ or p-type silicon substrate or a buried oxide (BOX) layer. If desired, layer 31 may be an n-type substrate. Substrate 31 may include an epitaxial layer such as an n-type or p-type epitaxial layer. The epitaxial layer may, for example, be a p-type epitaxial layer that is doped with boron or other suitable dopants. The epitaxial layer may be doped at densities of $10^{14}$-$10^{15}$ cm$^{-3}$ or other suitable densities. Photodiodes may be formed in the epitaxial layer of substrate 31.

Screen oxide layer 32 (e.g., a thin layer of silicon dioxide) may be used as a sacrificial layer that collects any debris during high energy ion implantation and which can be removed at the end of the ion implantation process. The thickness T1 of screen oxide layer 32 may be 90-100 angstroms, 95-110 angstroms, 80-120 angstroms, or other suitable thickness.

As shown in FIG. 5, isolation structures 90 may be formed in the uppermost portion of substrate 31. Isolation structures 90 may be shallow trench isolation (STI) structures or may be implants formed using conventional methods. For example, isolation structures 90 may be formed by depositing a layer of photoresist and patterning the layer of photoresist to form openings in isolation regions 24. Dopant may be implanted through the openings in the layer of photoresist to form isolation structures 90. Boron or any other suitable ion may be used to form implants 90.

Isolation structures 90 are shown in FIG. 5 with dashed lines because the presence of isolation structures 90 at this stage in the implantation process is optional. For example, isolation structures 90 may be formed prior to forming range modulated implants or may be formed much later in the fabrication process (e.g., after forming range modulated implants in substrate 31). Arrangements where isolation structures 90 are present before forming range modulated implants are described herein as an illustrative example.

Figure 6:
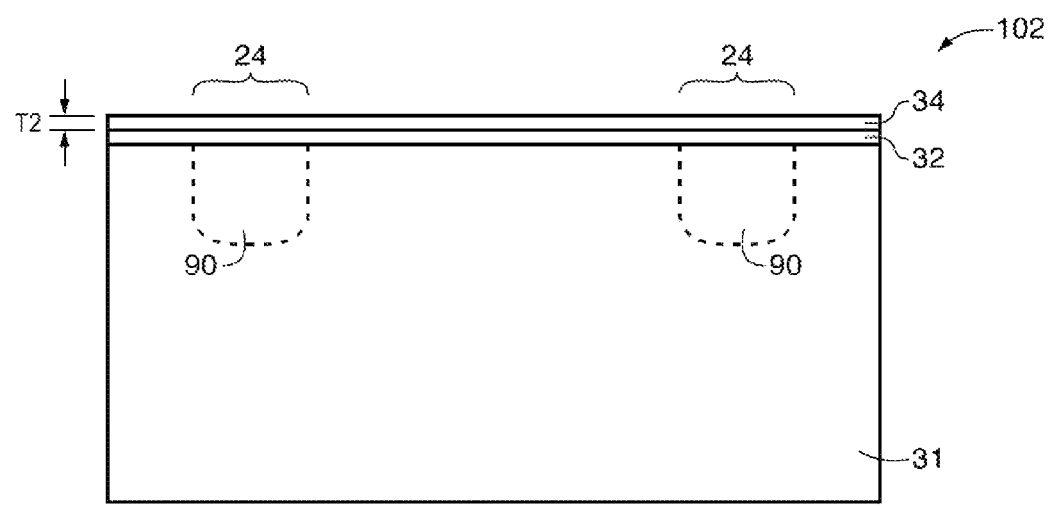
FIG. 6 is a cross-sectional side view of the image sensor of FIG. 5 after an etch stop layer has been deposited on the screen oxide layer in accordance with an embodiment of the present invention.

At step 102 of FIG. 6, a thin layer of etch stop material such as etch stop material 34 may be deposited over screen oxide layer 32. Etch stop material may, for example, be formed from titanium nitride or other suitable material and may serve as an etch stop for subsequent etching steps. The thickness T2 of layer 34 may be 100-200 angstroms, 50-150 angstroms, 100-300 angstroms, or other suitable thickness.

Figure 7:
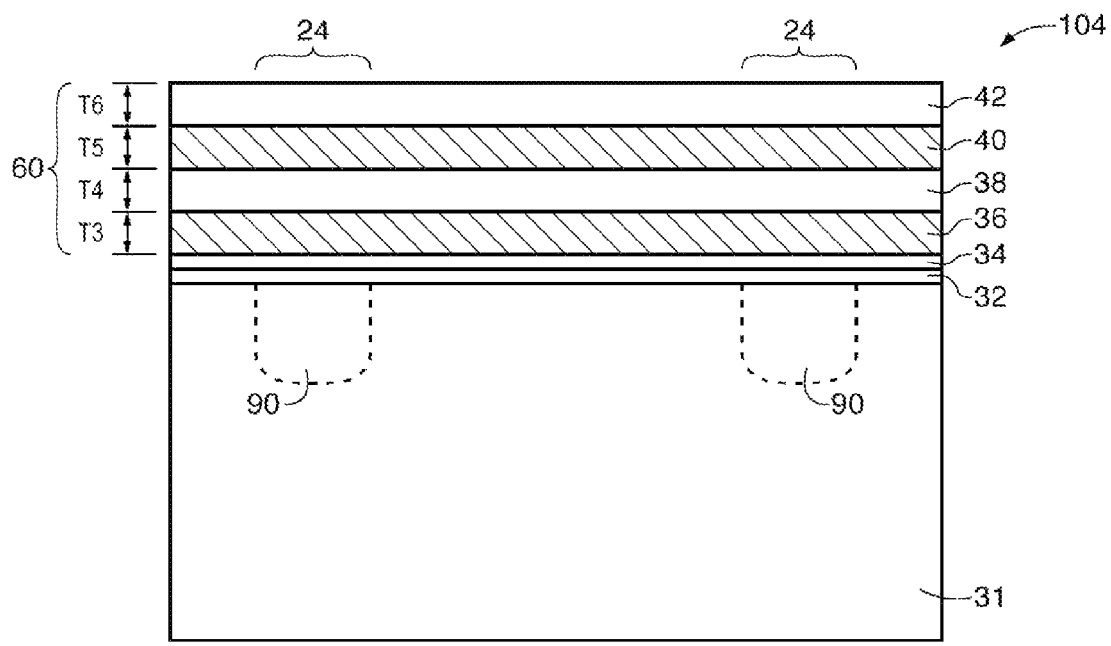
FIG. 7 is a cross-sectional side view of the image sensor of FIG. 6 after a stack of alternating layers of material have been deposited on the etch stop layer in accordance with an embodiment of the present invention.

At step 104 of FIG. 7, a stack 60 of alternating layers of material such as layers 36, 38, 40, and 42 may be deposited over etch stop layer 34. Illustrative materials that may be used for layers 36, 38, 40, and 42 include oxide, silicon nitride, nitride, silicon dioxide, other suitable materials, a combination of any two or more of these materials, etc. In one illustrative arrangement, which is described herein as an example, layer 36 may be an oxide layer, layer 38 may be a silicon nitride layer, layer 40 may be an oxide layer, and layer 42 may be a nitride layer. Layer 36 may have a thickness T3 of about 0.45 microns, layer 38 may have a thickness T4 of about 0.25 microns, layer 40 may have a thickness T5 of about 0.45 microns, and layer 42 may have a thickness T6 of about 0.25 microns (as examples). If desired other thicknesses may be used. Layers 36, 38, 40, and 42 may be deposited using chemical vapor deposition, physical vapor deposition, sputtering, or any other suitable deposition process.

The example of FIG. 7 in which four alternating layers of material are used in stack 60 is merely illustrative. In general, any suitable number of alternating layers may be used in stack 60 (e.g., four, five, six, more than six, less than six, etc.). The number of alternating layers formed over etch stop 34 may depend on the number of ion implants that are desired in each isolation region 24.

Figure 8:
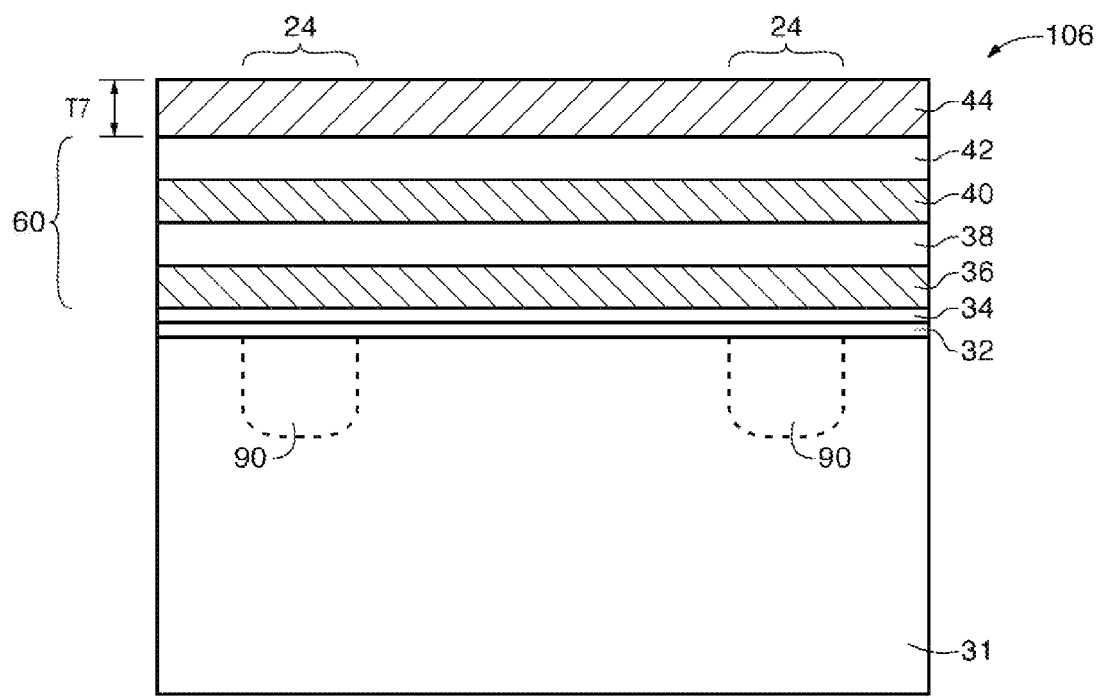
FIG. 8 is a cross-sectional side view of the image sensor of FIG. 7 after a photoresist layer has been deposited on the stack of alternating layers of material in accordance with an embodiment of the present invention.

At step 106 of FIG. 8, a layer of photoresist such as photoresist 44 may be spin-coated or otherwise deposited over top layer 42 of stack 60. Photoresist 44 may have a thickness T7 of about 0.45 microns, more than 0.50 microns, less than 0.50 microns, etc.

Figure 9:
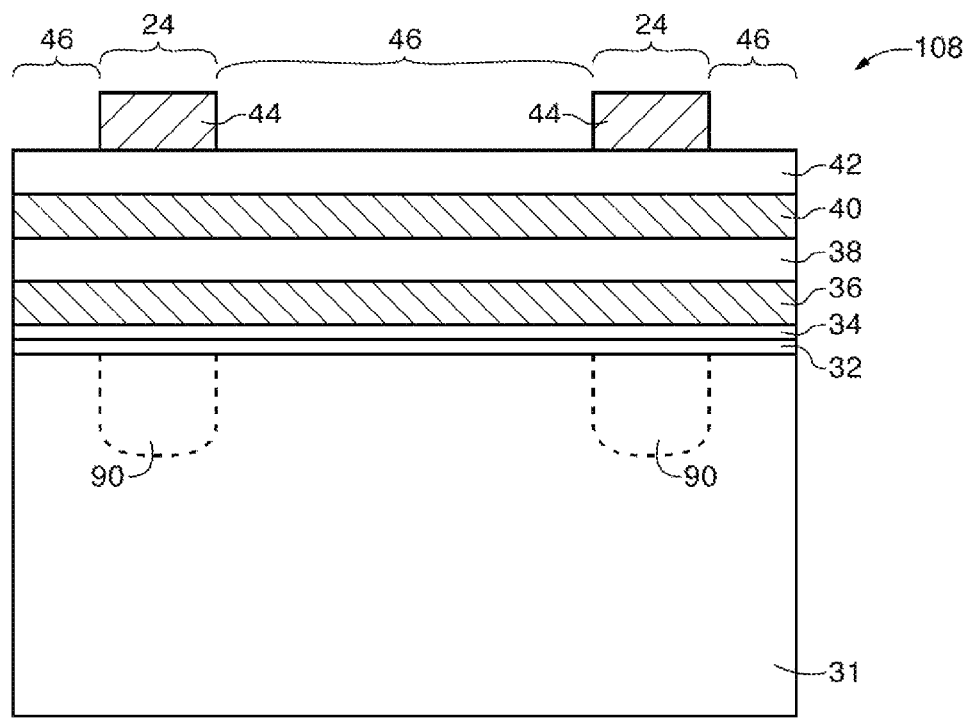
FIG. 9 is a cross-sectional side view of the image sensor of FIG. 8 after the photoresist layer has been patterned to form openings in the photoresist layer in accordance with an embodiment of the present invention.

At step 108 of FIG. 9, photoresist 44 may be patterned using photolithography to form openings 46 in photoresist 44. Openings 46 may be located in regions where range modulated implants are not desired. Photoresist 44 may remain in isolation regions 24 where range modulated implants are desired.

Figure 10:
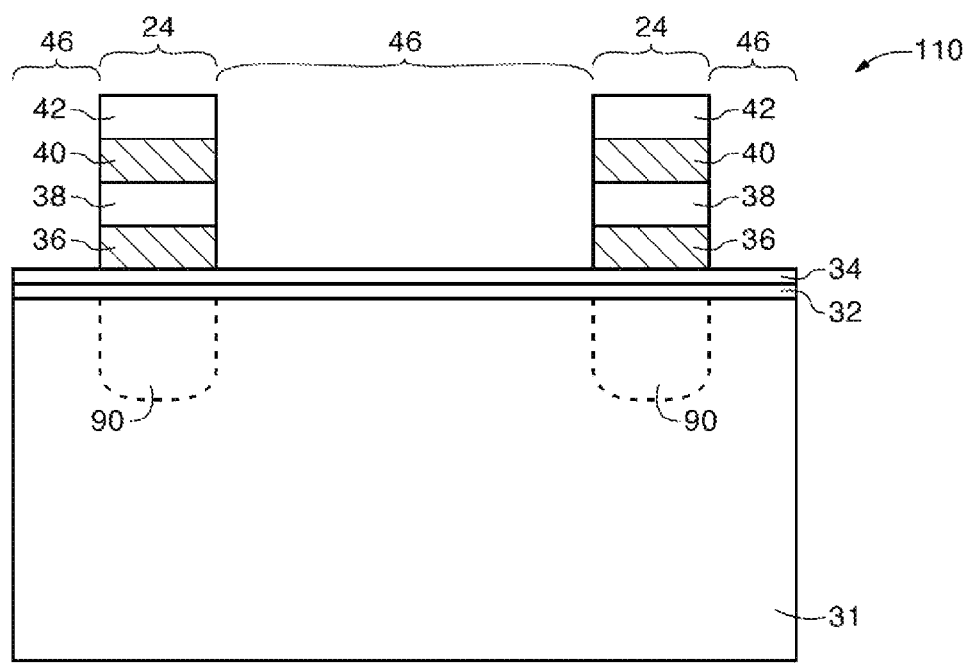
FIG. 10 is a cross-sectional side view of the image sensor of FIG. 9 after the stack of alternating layers of material has been etched and the photoresist layer has been removed in accordance with an embodiment of the present invention.

At step 110 of FIG. 10, stack 60 may be etched (e.g., dry etched) to remove portions of stack 60 that are not covered by photoresist 44 of FIG. 9 (e.g., portions in regions 46). This may include removing a portion of all of the layers in stack 60 up to etch stop layer 34. As shown in FIG. 10, pillars (sometimes referred to as islands) of stack 60 that were covered by photoresist 44 of FIG. 9 remain on substrate 31. Following removal of portions of stack 60 in regions 46, photoresist 44 may be removed (e.g., stripped). If desired, photoresist 44 may remain on pillars of stack 60 and may form the uppermost layer in stack 60. Arrangements in which photoresist 44 is removed before performing the ion implantation step 112 of FIG. 11 are described herein as an example.

Figure 11:
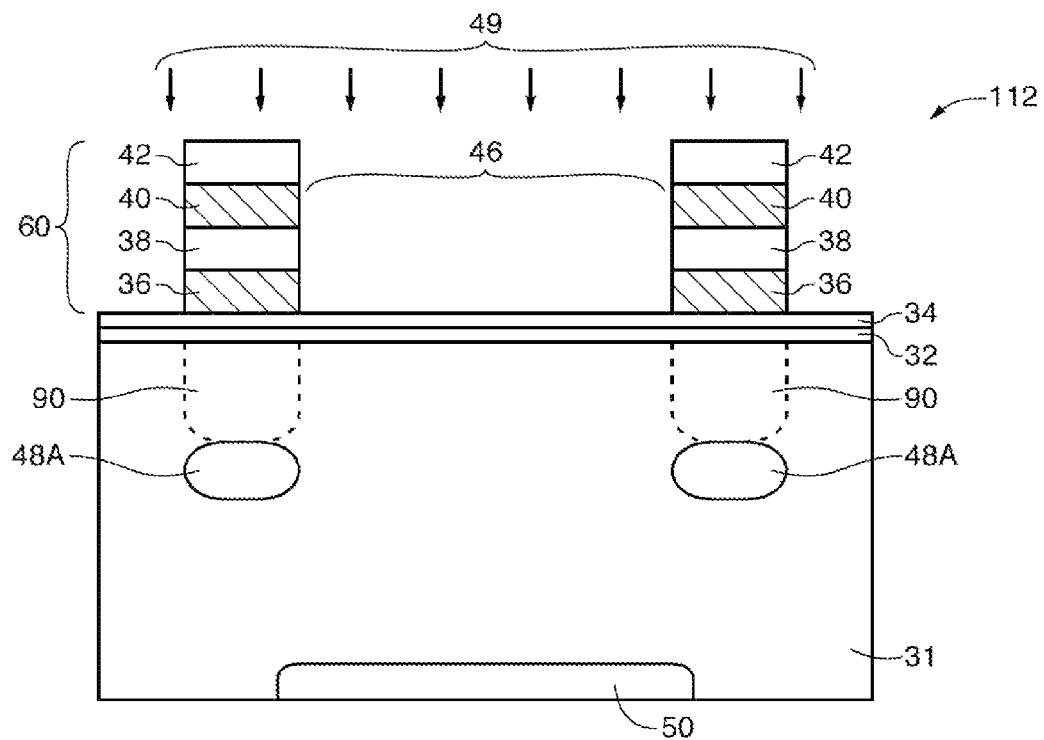
FIG. 11 is a cross-sectional side view of the image sensor of FIG. 10 after a first implant has been formed in the image sensor substrate by passing ions through the stack of alternating layers of material in accordance with an embodiment of the present invention.

At step 112 of FIG. 11, ion implantation may be performed, as denoted by arrows 49. The ion implantation of step 112 may, for example, be a boron implantation having an implantation energy of 3000 keV. This is, however, merely illustrative. If desired, other ions may be implanted at step 112 or other implantation energies may be used. The implanted ions may be the same ions that are used to form implants 90 or different ions may be used. In regions 24, ions pass through layers 42, 40, 38, and 36 of stack 60 to form implants 48A. Implants 48A may be below and connected to implants 90.

In regions 46 where there are openings in stack 60, implants such as implant 50 may be formed. Implant 50 may be formed deep within substrate 31. Implants 50 may be deeper than photodiodes 18 (see, e.g., FIG. 16). Implants such as implant 50 may be formed in a different portion of substrate 31 than implant 48A, if desired. For example, implant 48A may be formed in a p-type epitaxial layer, while implant 50 may be formed in a p-type substrate, a p+ substrate, a buried oxide layer or other substrate layer (e.g., a layer that is distinct from the p-type epitaxial layer). Implantation energies and the thickness of layers 36, 38, 40, and 42 in stack 60 can be chosen such that implants 48A are formed at the desired depth (e.g., immediately below implants 90).

Figure 12:
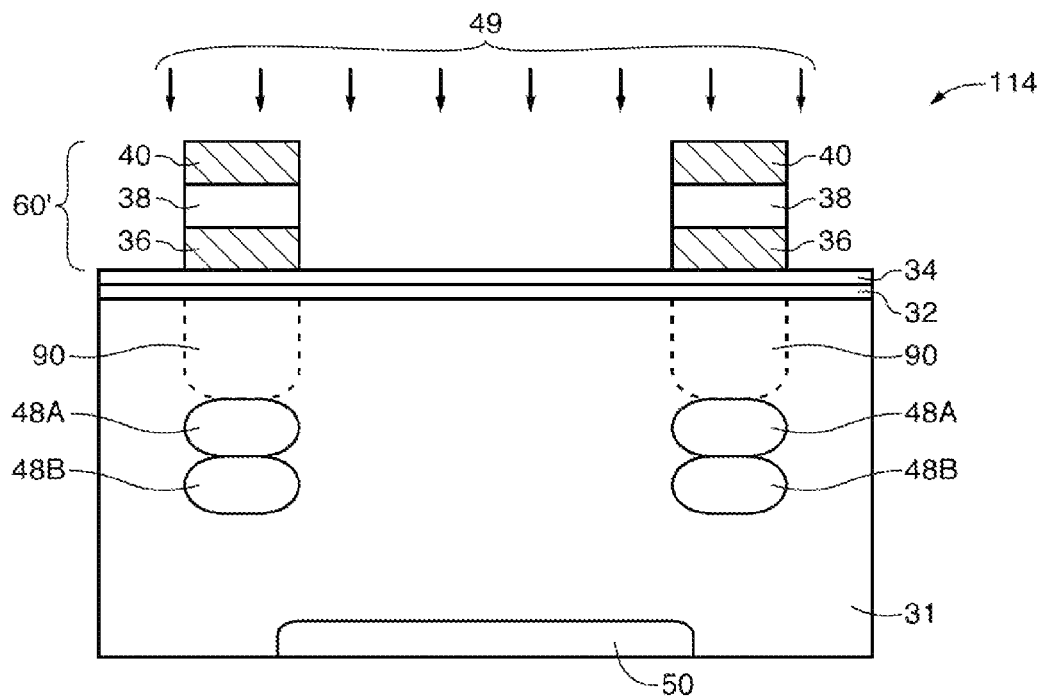
FIG. 12 is a cross-sectional side view of the image sensor of FIG. 11 after a top layer in the stack of alternating layers of material has been removed and a second implant has been formed in the image sensor substrate by passing ions through the remaining layers in the stack of alternating layers of material in accordance with an embodiment of the present invention.

At step 114 of FIG. 12, the top layer of stack 60 such as layer 42 may be removed to form stack 60'. For example, nitride layer 42 may be etched (e.g., anisotropically dry etched) such that oxide layer 40 is the top layer of stack 60'.

After removing layer 42, ion implantation may be performed, as denoted by arrows 49. The ion implantation of step 114 may, for example, be a boron implantation having an implantation energy of 3000 keV. This is, however, merely illustrative. If desired, other ions may be implanted at step 114 or other implantation energies may be used. The implanted ions may be the same ions that are used to form implants 90 and/or implants 48A or different ions may be used. In regions 24, ions pass through layers 40, 38, and 36 of stack 60' to form implants 48B. Implants 48B may be below and connected to implants 48A.

Figure 13:
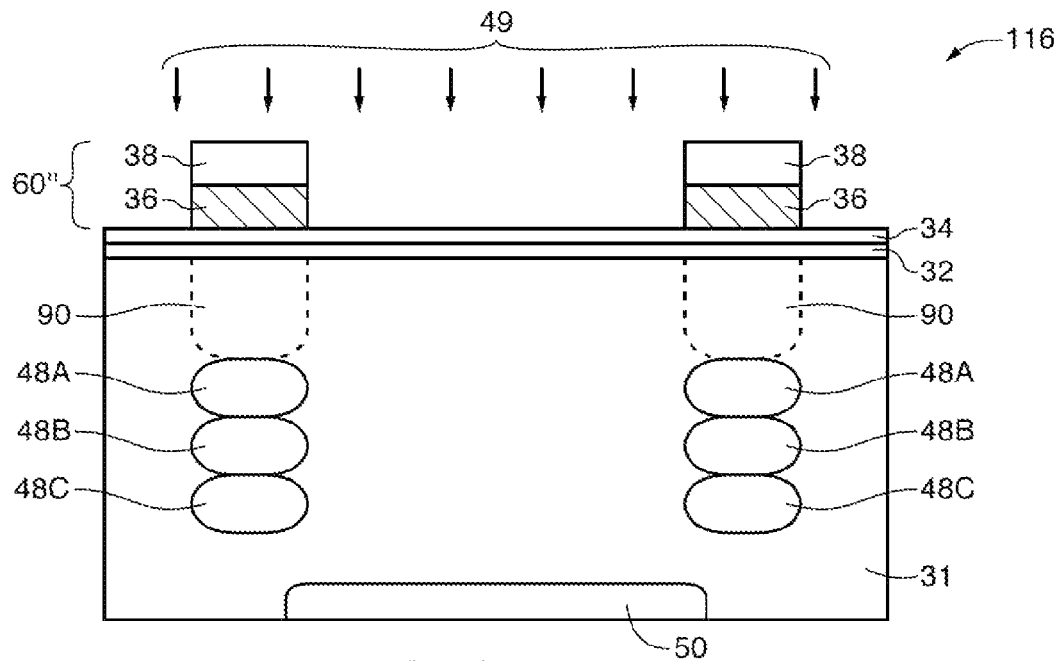
FIG. 13 is a cross-sectional side view of the image sensor of FIG. 12 after a top layer in the stack of alternating layers of material has been removed and a third implant has been formed in the image sensor substrate by passing ions through the remaining layers in the stack of alternating layers of material in accordance with an embodiment of the present invention.

At step 116 of FIG. 13, the top layer of stack 60' such as layer 40 may be removed to form stack 60". For example, oxide layer 40 may be etched (e.g., anisotropically dry etched) such that silicon nitride layer 38 is the top layer of stack 60".

After removing layer 40, ion implantation may be performed, as denoted by arrows 49. The ion implantation of step 116 may, for example, be a boron implantation having an implantation energy of 3000 keV. This is, however, merely illustrative. If desired, other ions may be implanted at step 116 or other implantation energies may be used. The implanted ions may be the same ions that are used to form implants 90, implants 48A, and/or implants 48B or different ions may be used. In regions 24, ions pass through layers 38 and 36 of stack 60" to form implants 48C. Implants 48C may be below and connected to implants 48B.

Figure 14:
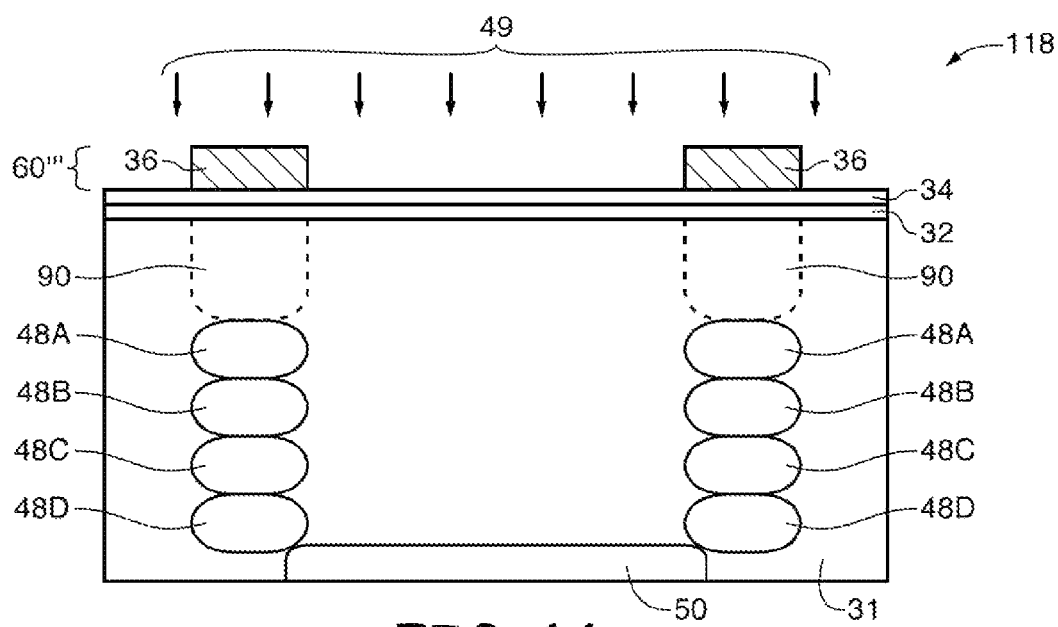
FIG. 14 is a cross-sectional side view of the image sensor of FIG. 13 after a top layer in the stack of alternating layers of material has been removed and a fourth implant has been formed in the image sensor substrate by passing ions through the remaining layer in the stack of alternating layers of material in accordance with an embodiment of the present invention.

At step 118 of FIG. 14, the top layer of stack 60" such as layer 38 may be removed to form stack 60'''. For example, silicon nitride layer 38 may be etched (e.g., anisotropically dry etched) such that oxide layer 36 is the top layer of stack 60'''. In this example, layer 36 is also the last layer of stack 60''' remaining on substrate 31.

After removing layer 38, ion implantation may be performed, as denoted by arrows 49. The ion implantation of step 118 may, for example, be a boron implantation having an implantation energy of 3000 keV. This is, however, merely illustrative. If desired, other ions may be implanted at step 118 or other implantation energies may be used. The implanted ions may be the same ions that are used to form implants 90, implants 48A, implants 48B, and/or implants 48C or different ions may be used. In regions 24, ions pass through layer 36 of stack 60''' to form implants 48D. Implants 48D may be below and connected to implants 48C. If desired, implants 48D may be connected to implant 50.

Figure 15:
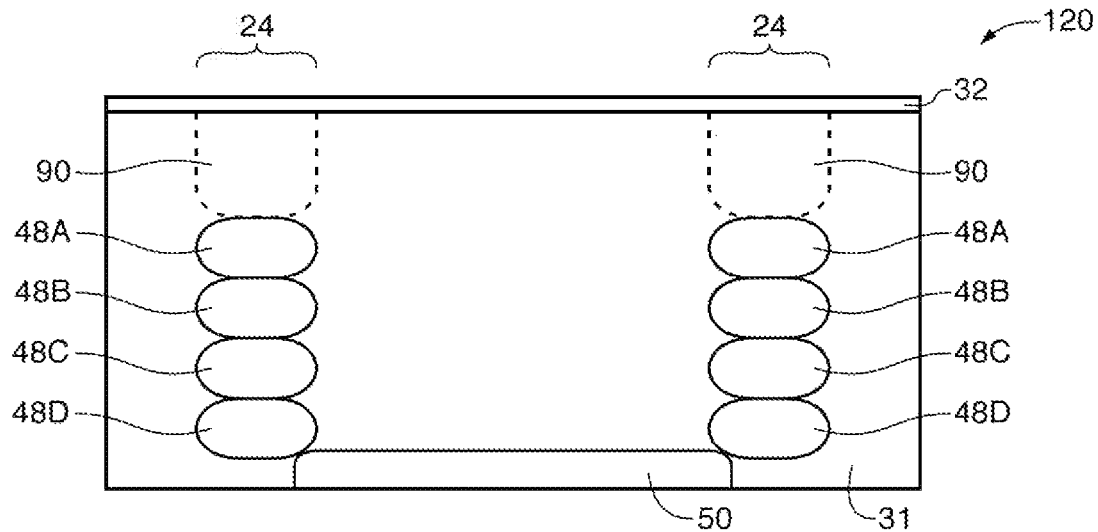
FIG. 15 is a cross-sectional side view of the image sensor of FIG. 14 after the last layer in the stack of alternating layers of material and the etch stop layer have been removed in accordance with an embodiment of the present invention.
Figure 16:
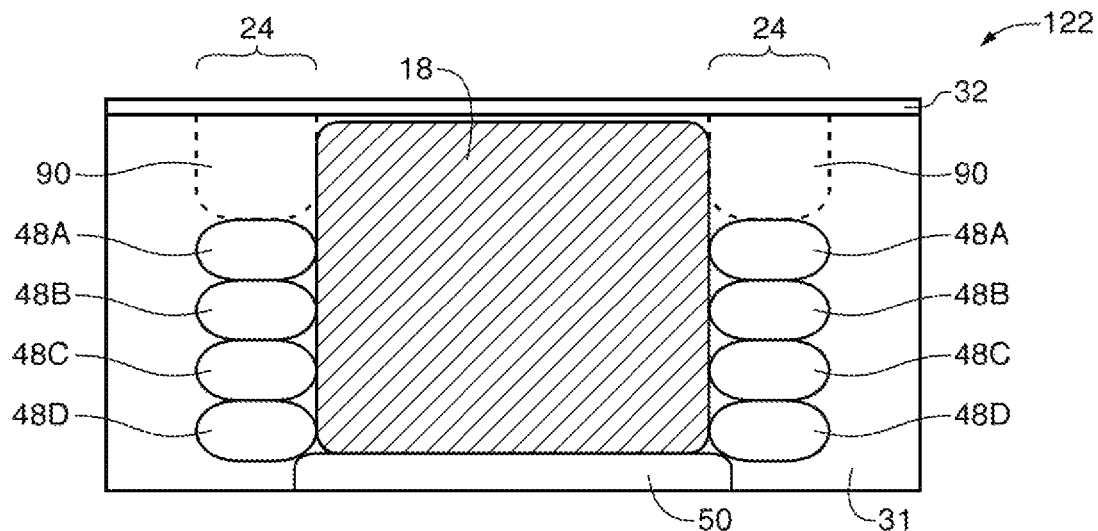
FIG. 16 is a cross-sectional side view of the image sensor of FIG. 15 after a photodiode has been formed between the range modulated implants in accordance with an embodiment of the present invention.

At step 120 of FIG. 15, the last layer of stack 60''' of FIG. 14 such as layer 36 may be removed. For example, oxide layer 36 may be stripped or etched (e.g., anisotropically dry etched) to expose etch stop layer 34. Following removal of oxide layer 36, etch stop layer 34 may also be removed.

At step 122 of FIG. 16, photodiode 18 may be formed between p-well isolation regions 24 (e.g., using masks, ion implantation, etc.). Photodiode 18 may be formed in substrate 31 before or after p-well isolation regions 24 have been formed.

In the example of FIGS. 5-16, isolation regions 24 are formed with four range modulated implants (e.g., implants 48A, 48B, 48C, and 48D). In general, isolation regions 24 may be formed having any suitable number of range modulated implants. If desired, shallow trench isolation (STI) structures may be formed above range modulated implants.

The number of layers in stack 60 and the thickness of each layer in stack 60 may be selected to achieve implants with any suitable depth. Implants that lie under thicker stack regions may be formed closer to the surface of substrate 31 while implants that lie under thinner stack regions may be formed deeper within substrate 31. For example, for the same ion implantation in energy, a thicker stack 60 may result in a relatively shallower implant region, while a thinner stack 60 may result in a relatively deeper implant.

The ion implantation energies used in the examples of FIGS. 11-14 are merely illustrative. Any suitable ion implantation energy may be used. For example, when implants such as implants 90 are formed through openings in photoresist, ion implantation energies may be approximately 950 keV, 950 keV or less, 900-1000 keV, 800-1200 keV, etc. When implants are formed through islands of material such as islands of stack 60, ion implantation energies may be approximately 3000 keV, 3200 keV, 3500 keV or less, more that 3200 keV, 3000-4000 keV, 2000 keV or more, 2500 keV or more, etc.

Various embodiments have been described for range modulated ion implantation for image sensors.

Photodiodes may be separated by isolation regions. The isolation regions may be p-well or n-well regions formed by ion implantation. The isolation regions may be formed in a multi-step process that reduces the number of photolithographic patterning steps (e.g., reduces the number of photolithographic patterning steps to one or two).

In an initial step, a thin screen oxide layer and a thin etch stop layer may be deposited on a substrate.

In a subsequent step, alternating layers of material may be deposited over the etch stop layer to form a stack. The stack may include, for example, alternating layers of oxide and nitride and/or alternating layers of oxide and silicon nitride. If desired, other materials may be used. The stack may include four, five, six, more than six, or less than six alternating layers of material.

In a subsequent step, a layer of photoresist may be deposited over the stack of alternating layers of material. The layer of photoresist may be patterned using photolithography to form openings in the layer of photoresist where range modulated implants are not desired. Portions of photoresist that remain may correspond to isolation regions where range modulated implants are desired.

In a subsequent step, the stack of alternating layers of material may be etched to remove portions of the stack that are not covered by photoresist. The stack may be etched up to the etch stop layer. Following removal of these portions, the photoresist may be removed.

In a subsequent step, ion implantation may be performed to form implants at a first depth by implanting ions through the layers of the stack that remain on the substrate.

In a subsequent step, the top layer of the stack may be removed and ion implantation may be performed to form implants at a second depth. The process of removing the top layer of the stack and performing ion implantation to form implants at the desired depth may be repeated until the desired number of range modulated implants are formed.

The foregoing is merely illustrative of the principles of this invention and various modifications can be made by those skilled in the art without departing from the scope and spirit of the invention.

What is claimed is:

1. A method of forming an image sensor with isolation regions in an image sensor substrate, comprising:
   depositing a plurality of layers onto an upper surface of the image sensor substrate, wherein the plurality of layers comprises at least a first layer formed from a first material, a second layer formed from a second material, a third layer formed from a third material, and a fourth layer formed from a fourth material, and wherein the first layer is interposed between the upper surface of the image sensor substrate and the second layer;
   implanting a first set of ions into the image sensor substrate through the first and second layers;
   after implanting the first set of ions into the image sensor substrate, removing the second layer;
   after removing the second layer, implanting a second set of ions into the image sensor substrate through the first layer;
   implanting a third set of ions into the image sensor substrate through the first, second, and third layers; and
   implanting a fourth set of ions into the image sensor substrate through the first, second, third, and fourth layers.

2. The method defined in claim 1 wherein removing the second layer comprises dry etching the second layer.

3. The method defined in claim 1 further comprising:
   removing the third layer before implanting the first set of ions into the image sensor substrate through the first and second layers.

4. The method defined in claim 3 wherein removing the third layer comprises dry etching the third layer.

5. The method defined in claim 1 further comprising:
   removing the fourth layer before implanting the third set of ions into the image sensor substrate through the first, second, and third layers.

6. The method defined in claim 1 wherein the second set of ions that are implanted into the image sensor substrate through the first layer are implanted at a first depth in the image sensor substrate, wherein the first set of ions that are implanted into the image sensor substrate through the first and second layers are implanted at a second depth in the image sensor substrate, wherein the third set of ions that are implanted into the image sensor substrate through the first, second, and third layers are implanted at a third depth in the image sensor substrate, and wherein the fourth set of ions that are implanted into the image sensor substrate through the first, second, third, and fourth layers are implanted at a fourth depth in the image sensor substrate.

7. The method defined in claim 6 wherein the third depth is greater than the fourth depth, wherein the second depth is greater than the third depth, and wherein the first depth is greater than the second depth.

8. The method defined in claim 1 wherein the first and second materials are selected from the group consisting of: oxide, nitride, and silicon nitride.

9. A method of forming isolation regions in an image sensor pixel array having a substrate with an upper surface, comprising:
   implanting a first set of ions into a first region of the substrate through first and second layers of material, wherein the first layer of material is different from the second layer of material, and wherein the first layer of material is interposed between the upper surface of the substrate and the second layer of material;
   after implanting the first set of ions into the first region, removing the second layer of material;
   after removing the second layer of material, implanting a second set of ions into a second region of the substrate through the first layer of material, wherein the second region is below the first region and contacting the first region;
   implanting a third set of ions into the substrate through the first layer, the second layer, and a third layer; and
   implanting a fourth set of ions into the substrate through the first layer, the second layer, the third layer, and a fourth layer.

10. The method defined in claim 9 wherein the first and second layers of material are formed from materials selected from the group consisting of: oxide, nitride, and silicon nitride.

11. The method defined in claim 9 further comprising:
   forming a photodiode in the substrate, wherein the first and second sets of ions isolate the photodiode from an adjacent photodiode.

12. The method defined in claim 9 further comprising:
   after implanting the second set of ions, removing the first layer of material.

13. The method defined in claim 12 wherein removing the first layer of material comprises dry etching the first layer of material, the method further comprising:
   after dry etching the first layer of material, removing an etch stop layer from the substrate.

14. A method of forming implants in a substrate having an upper surface, comprising:
   implanting a first set of ions in the substrate by passing the first set of ions through a plurality of layers that are formed on and over the upper surface of the substrate, wherein the first set of ions are implanted at a first depth in the substrate;
   after implanting the first set of ions in the substrate, removing an uppermost layer in the plurality of layers from the substrate;
   implanting a second set of ions in the substrate by passing the second set of ions through a first group of layers that remain on the substrate after removing the uppermost layer, wherein the second set of ions are implanted at a second depth in the substrate and wherein the second depth is greater than the first depth;
   after implanting the second set of ions, removing an additional layer from the first group of layers that remain on the substrate; and
   implanting a third set of ions in the substrate by passing the third set of ions through a second group of layers that remain on the substrate after removing the additional layer, wherein the third set of ions are implanted at a third depth in the substrate and wherein the third depth is greater than the second depth.

15. The method defined in claim 14 further comprising:
   depositing an etch stop layer onto the substrate;
   depositing the plurality of layers onto the substrate over the etch stop layer; and
   depositing and patterning a layer of photoresist on the plurality of layers to form a plurality of openings in the layer of photoresist.

16. The method defined in claim 15 further comprising:
   etching the plurality of layers up to the etch stop layer to remove portions of the plurality of layers that overlap the openings in the layer of photoresist; and
   after etching the plurality of layers up to the etch stop layer, removing the layer of photoresist from the substrate.

17. The method defined in claim 14 wherein the plurality of layers includes at least two materials selected from the group consisting of: oxide, silicon nitride, and nitride.

* * * * *